United States Patent
Chen et al.

(10) Patent No.: US 6,900,104 B1
(45) Date of Patent: May 31, 2005

(54) METHOD OF FORMING OFFSET SPACER MANUFACTURING FOR CRITICAL DIMENSION PRECISION

(75) Inventors: Ryan Chia-Jen Chen, Chiayi (TW);
Fang-Cheng Chen, Hsinchu (TW);
Yuan-Hung Chiu, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/788,754

(22) Filed: Feb. 27, 2004

(51) Int. Cl.⁷ .................. H01L 21/336; H01L 21/3205; H01L 21/4763; H01L 21/302; H01L 21/461

(52) U.S. Cl. ................ 438/303; 438/305; 438/595; 438/710; 438/756

(58) Field of Search ................ 438/303, 305, 438/595, 710, 756

(56) References Cited

U.S. PATENT DOCUMENTS

2003/0235966 A1 * 12/2003 Kim et al. ................ 438/305
2004/0248369 A1 * 12/2004 Wang et al. ................ 438/305

* cited by examiner

*Primary Examiner*—Olik Chaudhuri
*Assistant Examiner*—William M. Brewster
(74) *Attorney, Agent, or Firm*—Tung & Associates

(57) ABSTRACT

A method for forming an offset spacer adjacent a CMOS gate structure with improved critical dimension control including providing a substrate that has a gate structure; forming at least one oxide layer over the substrate; forming at least one nitride layer over the at least one oxide layer; dry etching the at least one nitride layer in a first dry etching process to expose a first portion of the at least one oxide layer; carrying out a wet etching process to remove the first portion of the at least one oxide layer; and, dry etching the at least one nitride layer in a second dry etching process to remove the at least one nitride layer leaving a second portion of the at least one oxide layer to form an oxide offset spacer along sidewalls of the gate structure.

21 Claims, 2 Drawing Sheets

METHOD OF FORMING OFFSET SPACER MANUFACTURING FOR CRITICAL DIMENSION PRECISION

FIELD OF THE INVENTION

This invention generally relates to processes for forming semiconductor devices including CMOS and MOSFET devices and more particularly to an offset spacer manufacturing method for precision control over critical dimensions (CD's).

BACKGROUND OF THE INVENTION

As MOSFET and CMOS device characteristic sizes are scaled below 0.13 microns including below 0.1 micron, the process window for wet and dry etching processes are increasingly difficult to control to achieve desired critical dimensions. For example, in forming dielectric offset spacers, also referred to as sidewall spacers, the required width of the offset spacer is increasingly smaller. For example, the width of the offset spacer may be as small as 100 Angstroms (10 nanometers) or less in 65 nanometer characteristic dimensioned CMOS devices.

The offset spacer dielectric is formed adjacent either side of the gate structure and serves to allow the formation of source/drain extensions (SDE) whereby a relatively lower amount of N or P-type doping is first formed in the semiconductor substrate adjacent the gate structure by ion implantation prior to forming the offset spacers which then act as an ion implant mask for forming higher doped regions adjacent the offset spacers.

As device characteristic dimensions shrink below about 0.13 microns, achieving close dimensional tolerances of offset spacers is critical to achieving reliable electric performance and avoiding short channel effects (SCE). For example, SDE regions affect SCE according to both depth and width of the SDE doped region. The width of the offset spacers determines at least the width of the SDE regions. Offset spacer formation typically requires both deposition and etching processes, for example, to first deposit and subsequently remove portions of deposited dielectric layers. As device sizes decrease below about 0.13 microns both the deposition process and the etching process have extremely narrow process windows whereby dimensional variation undesirably alters CD's and electrical performance of the CMOS device. For example, in 65 nanometer technologies, an offset spacer width may be as small as 50 Angstroms, making a variation in width of the offset spacer of 2–4 nm a variation of 40 to 80%. In addition, typical methods of measuring CD's such as SEM and TEM may make variation of a few nanometers difficult to accurately detect. Moreover, such a variation in offset spacer dielectric layer thickness or offset spacer will likely undesirably affect SDE formation thereby degrading electrical performance of the CMOS device including increasing SCE.

There is therefore a need in the semiconductor integrated circuit manufacturing art for an improved method for dielectric offset spacer formation to achieve a greater degree of precision in CD control thereby improving the electrical operating performance and reliability of CMOS devices.

It is therefore among the objects of the present invention to provide an improved method for dielectric offset spacer formation to achieve a greater degree of precision in CD control thereby improving the electrical operating performance and reliability of CMOS devices, in addition to overcoming other shortcomings of the prior art.

SUMMARY OF THE INVENTION

To achieve the foregoing and other objects, and in accordance with the purposes of the present invention, as embodied and broadly described herein, the present invention provides a method for forming an offset spacer adjacent a CMOS gate structure with improved critical dimension control.

In a first embodiment, the method includes providing a substrate comprising a gate structure; forming at least one oxide layer over the substrate; forming at least one nitride layer over the at least one oxide layer; dry etching the at least one nitride layer in a first dry etching process to expose a first portion of the at least one oxide layer; carrying out a wet etching process to remove the first portion of the at least one oxide layer; and, dry etching the at least one nitride layer in a second dry etching process to remove the at least one nitride layer leaving a second portion of the at least one oxide layer to form an oxide offset spacer along sidewalls of the gate structure.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to exemplary manufacturing processes where the method of the present invention may be advantageously used, it will be appreciated that the method of the present invention may be used in any oxide layer or spacer oxide layer formation process where close critical dimensional tolerances of the oxide layer or spacer oxide layer are desired in addition to avoiding the loss of adjacent or underlying silicon containing material.

Figure 1A:
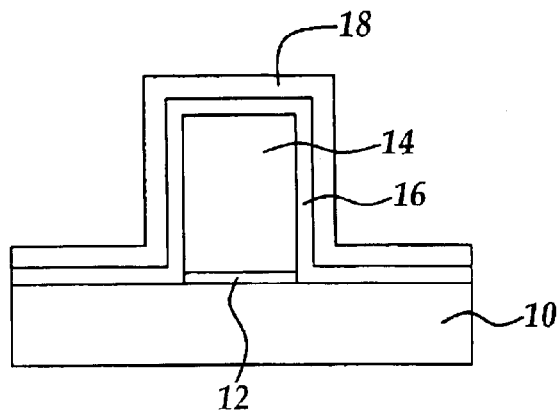
FIGS. 1A–1D are cross sectional views of a portion of a gate structure portion of an exemplary MOSFET showing exemplary manufacturing stages in an integrated circuit manufacturing process according to an embodiment of the present invention.

Referring to FIG. 1A is shown an exemplary implementation of the method of the present invention. Shown is a silicon substrate 10, having overlying oxide layers e.g., gate oxide portion 12, and spacer oxide layer portion 16 overlying polysilicon gate electrode portion 14. Gate oxide portion 12 and overlying polysilicon gate electrode portion 14 are formed by conventional deposition, lithographic and etching processes followed by blanket deposition of a layer of spacer oxide 16, for example less than about 150 Angstroms, including less than about 100 Angstroms thin (less than about 100 Angstroms), e.g., by a CVD process, for example an LPCVD process using e.g., TEOS and $O_3$. A layer 18 of silicon nitride, (e.g., $Si_3N_4$, SiN), for example less than about 150 Angstroms is then blanket deposited over the spacer oxide layer 16, e.g., by an LPCVD process. Alternatively, the layer 18 may be a silicon oxynitride layer.

Figure 1B:
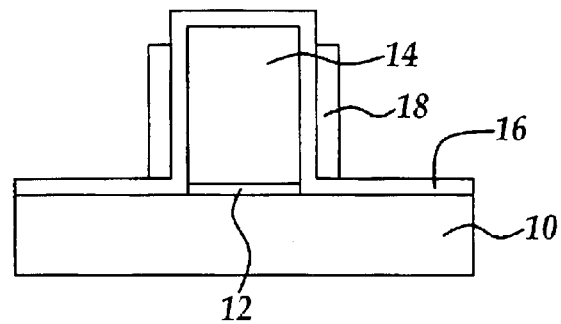

Referring to FIG. 1B, in an aspect of the present invention, the silicon nitride layer 18 is then subjected to a first selective dry etching process to selectively remove a portion of the silicon nitride layer 18, for example including over the horizontally disposed surface portions of underlying oxide layer 16 to stop on the oxide layer 16 in addition to maintaining a desired width dimension of the remaining silicon nitride layer 18 portion along the sidewalls of polysilicon gate electrode portion 14. According to a preferred aspect of the invention, the first silicon nitride dry etching process may include a conventional silicon nitride dry etching process, but more preferably includes a dry etching chemistry formed by plasma gas sources including $CF_4$ and fluorohydrocarbons, preferably $CH_2F_2$. In addition, carrier gases such as argon, helium, and nitrogen or mixtures thereof may be included as well. In a more preferred etching chemistry, oxygen is also included as a plasma gas source. In an exemplary plasma etching process, a dry etching chemistry is formed by supplying plasma gas sources $CF_4$, $O_2$, Ar, and $CH_2F_2$, at a respective flow rate of about 100 sccm, 400 sccm, 400 sccm, and 100 sccm. Preferably, the dry etching chemistry is formed with a fluorine to carbon ratio about 3 or less. It will be appreciated that other fluorohydrocarbons and perfluorocarbons may be used in place of, or in addition to, $CH_2F_2$ in appropriate proportions to achieve the desired fluorine to carbon ratio.

According to an aspect of the present invention, the dry etching process may be carried out by any conventional plasma enhanced etching process, but to minimize damage due to ion bombardment to the underlying oxide layer 16, the dry etching process is preferably carried out according to a downstream plasma etch process, where the plasma is created upstream with respect to the process wafer etching chamber.

Figure 2:
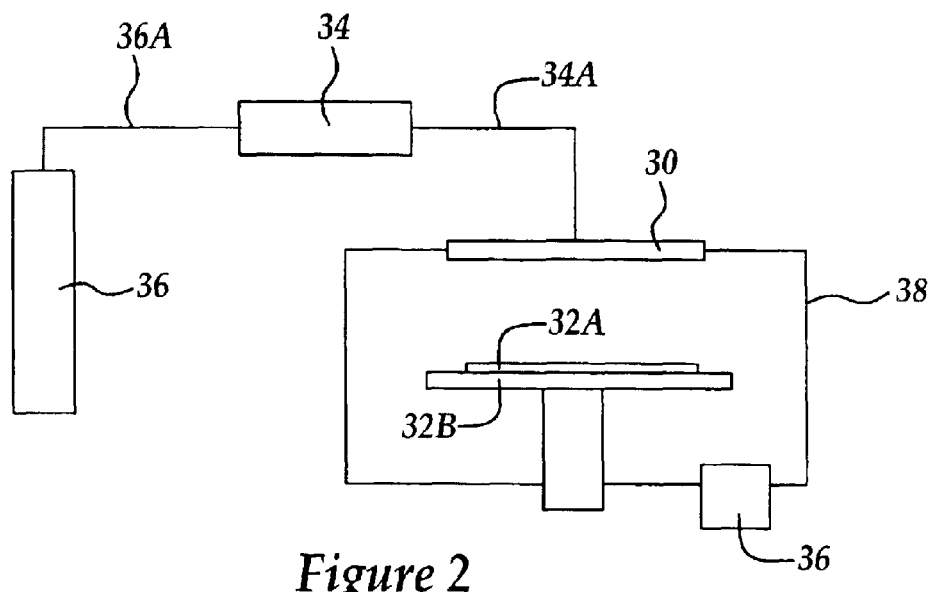
FIG. 2 is an exemplary downstream plasma reactor for carrying out an embodiment of the present invention.

Referring to FIG. 2 is shown an exemplary downstream plasma etcher configuration suitable for use with the method of the present invention. Plasma source 34 generally comprises a chamber coupled to one or more plasma gas sources e.g., 36 via gas lines e.g., 36A. Plasma source 34 is positioned upstream of process chamber e.g., 38 and fluidly coupled by a conduit e.g., 34A to process chamber 38 through a gas diffusion (distribution) manifold 30. The plasma generated by the plasma source 34 enters the process chamber 38 through the gas diffusion manifold 30 and is directed downward to impact process wafer 32A supported on wafer pedestal 32B. The wafer pedestal 32B may be connected to a DC or an RF bias source (not shown). A gas pumping port, e.g., 36 maintains a desired operating pressure in the process chamber, for example between about 0.1 Torr and about 1 Torr. The plasma source 34 may include an RF generator and electrodes (not shown) and may include deflectors (not shown) to direct the flow of gas in a spiral flow pattern. The plasma source 34, for example, may operate at between about 300 and about 2000 Watts of RF power, at a frequency between about 1 MHz and about 100 MHz. The plasma source 34 may alternately include a microwave plasma source including a microwave cavity coupled to a microwave generator operating between about 200 and 1000 watts, at a frequency of between about 1 and 5 GHz, preferably about 2.45 GHz.

Figure 1C:
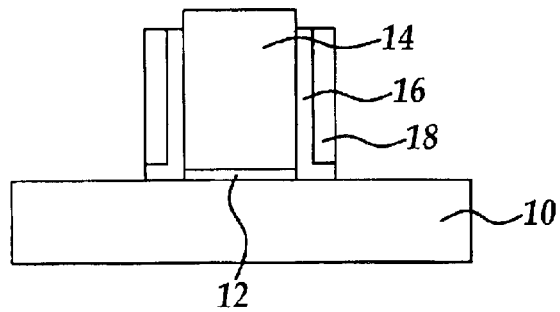

Referring back to FIG. 1C, following the first silicon nitride dry etching process, a wet etching process is carried out to remove exposed spacer oxide layer 16 portions, e.g., those portions not covered by remaining sidewall silicon nitride layer 18 portion. It will be appreciated that the wet etching process may be preceded by a conventional polymer stripping process to remove polymer etching residues from the first silicon nitride dry etching process. Preferably, the wet etching process includes a dipping, spraying, or vapor contacting process with a conventional HF containing wet etching solution, for example including a buffer such as ammonium fluoride ($NH_4F$), for example 10 parts $NH_4F$ to 1 part 48% HF, diluted with deionized water.

Figure 1D:
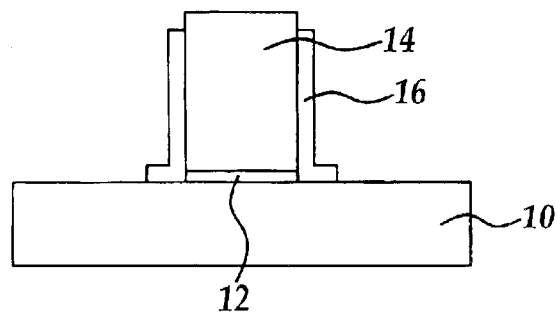

Referring to FIG. 1D, in an important aspect of the invention, following the wet etching process, a second silicon nitride dry etching process is carried out including the preferred embodiments outline for the first silicon nitride dry etching process to remove remaining portions of the silicon nitride layer 18 along the sidewalls of polysilicon gate electrode 14 to leave remaining oxide layer 16 portions (oxide spacers) along the sidewalls of polysilicon gate electrode 14. Preferably, the dry etching chemistry is formed to have perform a silicon nitride etch process having a silicon nitride to silicon oxide etch selectivity greater than about 130, more preferably greater than about 150. In addition, the dry etching chemistry is preferably formed to have a silicon nitride to silicon etching selectivity greater than about 25, more preferably greater than about 30. Preferably, the second silicon nitride dry etching process is carried out as a downstream plasma etching process as outlined above for a preferred embodiment of the first silicon nitride dry etching process.

Thus, a method for producing oxide offset spacers in a CMOS device manufacture process has been presented that allows precise control over the width of the oxide offset spacer. For example, by using the method of the present invention, including the second silicon nitride dry etching process according to preferred embodiments, underlying oxide layer etching and damage to underlying silicon substrate portions is avoided, thereby allowing a significant improvement in width control to a desired offset spacer thickness. For example, using the preferred dry etching chemistry with the desired SiN/oxide selectivity in the second silicon nitride dry etching process according to preferred embodiments, a typical silicon nitride dry etching process results in less than about 1 Angstrom of oxide layer loss (etching) and less than about 6 Angstroms of silicon substrate loss (etching). Advantageously, the improved width precision in forming the offset spacer allows improved device performance including reducing short channel effects by making subsequent ion implants such as SDE and halo implants more precisely positioned.

Figure 3:
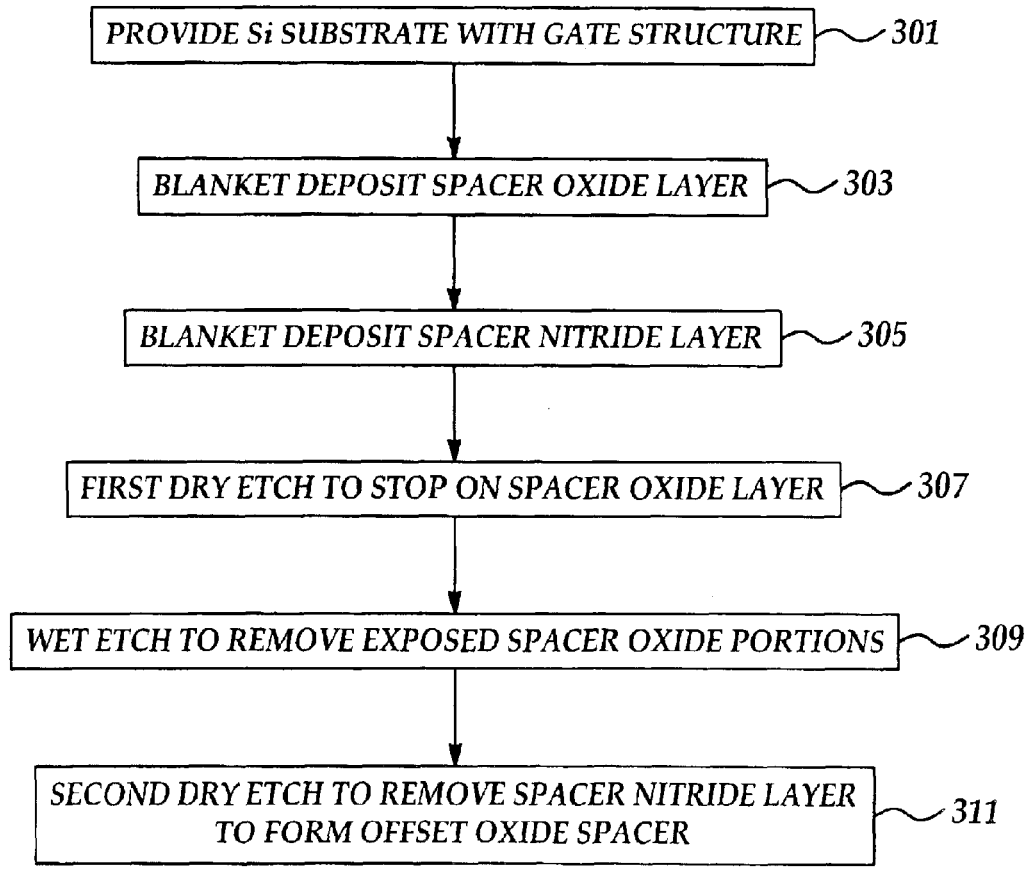
FIG. 3 is a process flow diagram including several embodiments of the present invention.

Referring to FIG. 3 is a process flow diagram including several embodiments of the present invention. In process 301, a silicon substrate including a CMOS gate structure is provided. In process 303, an overlying layer of spacer dielectric oxide is blanket deposited. In process 305, an overlying layer of spacer dielectric nitride is blanket deposited. In process 307, a first nitride dry etching process is carried out to stop on the spacer dielectric oxide layer. In process 309, a wet etching process is carried out to remove exposed portions of the spacer dielectric oxide layer to leave sidewall portions of the gate structure having a sidewall spacer dielectric nitride layer portion overlying a sidewall spacer dielectric oxide layer portion. In process 311, a second nitride dry etching process according to preferred embodiments is carried out to remove the remaining portion of the sidewall spacer dielectric nitride layer to leave sidewall (offset) spacer dielectric oxide layer portion.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming an offset spacer adjacent a CMOS gate structure comprising the steps of:
   providing a substrate comprising a gate structure;
   forming at least one oxide layer overlying the substrate;
   forming at least one nitride layer overlying the at least one oxide layer;
   etching the at least one nitride layer in a first dry etching process to expose a first portion of the at least one oxide layer;
   carrying out a wet etching process to remove the first portion of the at least one oxide layer; and,
   etching the at least one nitride layer in a second dry etching process to remove the at least one nitride layer leaving a second portion of the at least one oxide layer to form an oxide offset spacer along sidewalls of the gate structure.

2. The method of claim 1, wherein at least the second dry etching process comprises an etching chemistry having a fluorine to carbon ratio of about 3 or less.

3. The method of claim 1, wherein the first and second dry etching processes comprise an etching chemistry having a fluorine to carbon ratio of about 3 or less.

4. The method of claim 1, wherein at least the second dry etching process comprises $CF_4$ and fluorohydrocarbon plasma source gases.

5. The method of claim 1, wherein at least the second dry etching process comprises $CF_4$ and $CH_2F_2$ plasma source gases.

6. The method of claim 1, wherein at least the second dry etching process comprises $CF_4$, $CH_2F_2$, and $O_2$ plasma source gases.

7. The method of claim 1, wherein at least the second dry etching process comprises $CF_4$, fluorohydrocarbon, and $O_2$ plasma source gases with an additional plasma source gas selected from the group consisting of argon, helium, and nitrogen.

8. The method of claim 1, wherein at least the second dry etching process comprises a downstream plasma etching process.

9. The method of claim 1, wherein the at least one nitride layer is selected from the group consisting of silicon nitride and silicon oxynitride.

10. The method of claim 1, wherein the step of wet etching comprises an HF containing wet etching solution.

11. The method of claim 1, wherein at least the second dry etching process is carried with a nitride to oxide selectivity of greater than about 130.

12. The method of claim 1, wherein the width of the oxide offset spacer is formed at a width of less than about 150 Angstroms.

13. A method for forming an oxide offset spacer along a CMOS gate structure sidewall comprising the steps of:
   providing a silicon substrate comprising a polysilicon gate structure;
   forming a silicon oxide layer overlying the substrate;
   forming a silicon nitride layer overlying the silicon oxide layer;
   etching the silicon nitride layer in a first dry etching process comprising fluorohydrocarbons to expose a first portion of the silicon oxide layer;
   carrying out a wet etching process to remove the first portion of the silicon oxide layer; and,
   etching the silicon nitride layer in a second dry etching process comprising fluorohydrocarbons having a silicon nitride to silicon oxide etch selectivity of greater than about 130 to remove the silicon nitride layer leaving a second portion of the silicon oxide layer to form a silicon oxide offset spacer.

14. The method of claim 13, wherein the second dry etching process comprises an etching chemistry having a fluorine to carbon ratio of about 3 or less.

15. The method of claim 13, wherein the second dry etching process comprises $CF_4$ and $CH_2F_2$ plasma source gases.

16. The method of claim 13, wherein the second dry etching process comprises $CF_4$, $CH_2F_2$, and $O_2$ plasma source gases.

17. The method of claim 13, wherein the second dry etching process comprises $CF_4$, fluorohydrocarbon, and $O_2$ plasma source gases with an additional plasma source gas selected from the group consisting of argon, helium, nitrogen, and mixtures thereof.

18. The method of claim 13, wherein the second dry etching process comprises a downstream plasma etching process.

19. The method of claim 13, wherein the step of wet etching comprises an HF containing wet etching solution.

20. The method of claim 13, wherein the second dry etching process is carried with a silicon nitride to silicon oxide etch selectivity of greater than about 150.

21. The method of claim 13, wherein the silicon oxide offset spacer is formed at a width of less than about 150 Angstroms.

* * * * *